United States Patent
Nagashima et al.

(10) Patent No.: US 11,722,221 B2
(45) Date of Patent: Aug. 8, 2023

(54) OPTICAL MODULE

(71) Applicant: FURUKAWA ELECTRIC CO., LTD., Tokyo (JP)

(72) Inventors: Kazuya Nagashima, Tokyo (JP); Yozo Ishikawa, Tokyo (JP); Atsushi Izawa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 163 days.

(21) Appl. No.: 17/401,182

(22) Filed: Aug. 12, 2021

(65) Prior Publication Data
US 2021/0376931 A1 Dec. 2, 2021

Related U.S. Application Data

(63) Continuation of application No. PCT/JP2020/005157, filed on Feb. 10, 2020.

(30) Foreign Application Priority Data

Feb. 14, 2019 (JP) .................................. 2019-024321

(51) Int. Cl.
*H04B 10/00* (2013.01)
*H04B 10/40* (2013.01)
(Continued)

(52) U.S. Cl.
CPC ............. *H04B 10/40* (2013.01); *G02B 6/122* (2013.01); *G02B 6/4295* (2013.01); *G02B 6/43* (2013.01);
(Continued)

(58) Field of Classification Search
CPC ...... H04B 10/40; H04B 10/503; H04B 10/60; G02B 6/122; G02B 6/4295; G02B 6/43; G02B 6/4257; H01L 31/0232
See application file for complete search history.

(56) References Cited

U.S. PATENT DOCUMENTS

2005/0213994 A1  9/2005  Dudek et al.
2005/0224946 A1* 10/2005  Dutta ................... G02B 6/4257
                                            257/686
(Continued)

FOREIGN PATENT DOCUMENTS

JP  2008-251770 A  10/2008
JP  2011-216629 A  10/2011
(Continued)

OTHER PUBLICATIONS

International Search Report dated Mar. 31, 2020 in PCT/JP2020/005157 filed Feb. 10, 2020, 2 pages.

*Primary Examiner* — Pranesh K Barua
(74) *Attorney, Agent, or Firm* — Oblon, McClelland, Maier & Neustadt, L.L.P.

(57) ABSTRACT

An optical module includes: photoelectric elements including first terminal groups; an integrated circuit including second terminal groups and ground terminals; a carrier substrate; a housing; and a common ground pad. Further, the carrier substrate is fixed to one surface of the housing, the carrier substrate includes signal wiring parts and a ground wiring part, the ground wiring part includes terminal pattern parts, a common pattern part, and a coupling part, each of the terminal pattern parts being disposed between the corresponding signal wiring parts and electrically connected with one of the ground terminals, the common pattern part being disposed on a side where the common ground pad is provided on the carrier substrate, the coupling part electrically connecting each terminal pattern part and the common pattern part, and the ground terminals of the integrated circuit are electrically connected with the common ground pad through the ground wiring part.

12 Claims, 6 Drawing Sheets

(51) Int. Cl.
G02B 6/122 (2006.01)
G02B 6/42 (2006.01)
G02B 6/43 (2006.01)
H01L 31/0232 (2014.01)
H04B 10/50 (2013.01)

(52) U.S. Cl.
CPC ....... H01L 31/0232 (2013.01); H04B 10/503 (2013.01); *G02B 6/4257* (2013.01)

(56) References Cited

U.S. PATENT DOCUMENTS

| | | | |
|---|---|---|---|
| 2014/0255042 A1* | 9/2014 | Kaikkonen | H05K 1/0243 398/208 |
| 2016/0103286 A1 | 4/2016 | Matsui | |
| 2016/0134388 A1* | 5/2016 | Sato | G02B 6/4284 398/79 |
| 2016/0218810 A1* | 7/2016 | Nagashima | H04B 10/40 |
| 2017/0038254 A1* | 2/2017 | Yagisawa | G01J 1/4228 |
| 2019/0312652 A1* | 10/2019 | Shiraishi | H04B 10/693 |

FOREIGN PATENT DOCUMENTS

| | | |
|---|---|---|
| JP | 2014-36100 A | 2/2014 |
| JP | 2014-204022 A | 10/2014 |
| JP | 2015-191054 A | 11/2015 |
| JP | 2016-81060 A | 5/2016 |
| JP | 2017-98616 A | 6/2017 |

* cited by examiner

— CALCULATION EXAMPLE 1 (3.2 mm)
······ CALCULATION EXAMPLE 2 (3.3 mm)
— — CALCULATION EXAMPLE 3 (3.5 mm)
- - - CALCULATION EXAMPLE 4 (4.1 mm)
-·-· CALCULATION EXAMPLE 5
-··- CALCULATION EXAMPLE 6

OPTICAL MODULE

CROSS-REFERENCE TO RELATED APPLICATION(S)

This application is a continuation of International Application No. PCT/JP2020/005157, filed on Feb. 10, 2020 which claims the benefit of priority of the prior Japanese Patent Application No. 2019-024321, filed on Feb. 14, 2019, the entire contents of which are incorporated herein by reference.

BACKGROUND

The present disclosure relates to an optical module.

In a large-capacity optical communication system, a digital coherent transceiver is used as an optical transceiver that is an optical module configured to transmit and receive a signal beam. The digital coherent transceiver has a configuration in which a plurality of optical components and a plurality of electronic components are housed in one housing. For example, Japanese Laid-open Patent Publication No. 2016-081060 discloses an optical transceiver for compliance with CFP2 standards in a multi-source agreement (MSA), which is an agreement related to compatible products having common specifications.

In a disclosed configuration of the optical module, an optical waveguide substrate as an optical element configured to guide the signal beam is joined with a photoelectric element configured to receive the signal beam and output a current signal (Japanese Laid-open Patent Publication No. 2015-191054). The photoelectric element is mounted on an interposer substrate as a carrier substrate. Accordingly, the carrier substrate is fixed to the optical waveguide substrate through the photoelectric element. The photoelectric element is electrically connected with an IC as a signal amplification integrated circuit through the carrier substrate.

SUMMARY OF THE INVENTION

There is a need for providing an optical module having a reduced size and reduced reliability degradation.

According to an embodiment, an optical module includes: a plurality of photoelectric elements including first terminal groups each including an anode terminal and a cathode terminal; an integrated circuit including a plurality of second terminal groups and a plurality of ground terminals, the second terminal groups being electrically connected with the respective first terminal groups of the photoelectric elements, and a plurality of ground terminals each being disposed between two of the second terminal groups; a carrier substrate on which the photoelectric elements are arrayed in a predetermined array direction and mounted; a housing in which the photoelectric elements, the integrated circuit, and the carrier substrate are housed; and a common ground pad provided in the housing on at least one end side of the carrier substrate in the array direction. Further, the carrier substrate is fixed to one surface of the housing, the carrier substrate includes a plurality of signal wiring parts and a ground wiring part, the signal wiring parts being interposed in electrical connection between the first terminal groups of the photoelectric elements and the respective second terminal groups of the integrated circuit, the ground wiring part includes a plurality of terminal pattern parts, a common pattern part, and a coupling part, each of the terminal pattern parts being disposed between corresponding ones of the signal wiring parts and electrically connected with a corresponding one of the ground terminals, the common pattern part being disposed on a side where the common ground pad is provided on the carrier substrate, the coupling part electrically connecting each terminal pattern part and the common pattern part, and the ground terminals of the integrated circuit are electrically connected with the common ground pad through the ground wiring part of the carrier substrate.

DETAILED DESCRIPTION

In the related art, in a differential quadrature phase shift keying (DQPSK) scheme or the like, a signal beam is separated into four rays of the signal beam, and the four rays are received by four photoelectric elements. The signal beam is modulated with a high-frequency signal, and accordingly, current signals output from the four photoelectric elements include the high-frequency signal. Thus, at a current signal input stage of the IC, isolation between signal input terminals is typically achieved by a ground terminal. In this case, to stabilize the potential of the ground terminal, the ground terminal is preferably electrically connected with a common ground pad provided to the housing.

Thus, in the configuration of Japanese Laid-open Patent Publication No. 2015-191054, a wire can be connected from the ground terminal on the current signal input stage side of the IC to a base side through the gap between the IC and the carrier substrate and connected with a ground pad provided to the base. However, the gap between the IC and the carrier substrate is extremely narrow for size reduction of the optical module, and thus it is difficult to route the wire through the gap.

Alternatively, in the configuration of Japanese Patent Application Laid-open No. 2015-191054, such a method can be considered that the carrier substrate is stretched to the base side and fixed to the base, and is connected from the ground terminal on the current signal input stage side of the IC to the ground pad provided to the base through a ground wiring pattern formed on the carrier substrate. However, in this case, the carrier substrate is fixed to two surfaces substantially orthogonal to each other, namely, a surface on the photoelectric element side and a surface on the base side. As a result, stress is applied on the carrier substrate in two directions in accordance with, for example, change of temperature such as environment temperature. In this case, the carrier substrate may potentially flake, and reliability of the optical module may potentially decrease.

An embodiment will be described below with reference to the accompanying drawings. The present disclosure is not limited by the embodiment. In description of the drawings, elements identical or corresponding to each other are denoted by the same reference sign as appropriate. The drawings are schematic, and the dimensional relations between elements, the ratios of elements, and the like are different from those in reality in some cases. The dimensional relations between elements and the ratios of elements are also different between the drawings in some cases. The drawings include xyz coordinate axes as appropriate, with respect to which directions are described.

Figure 1:
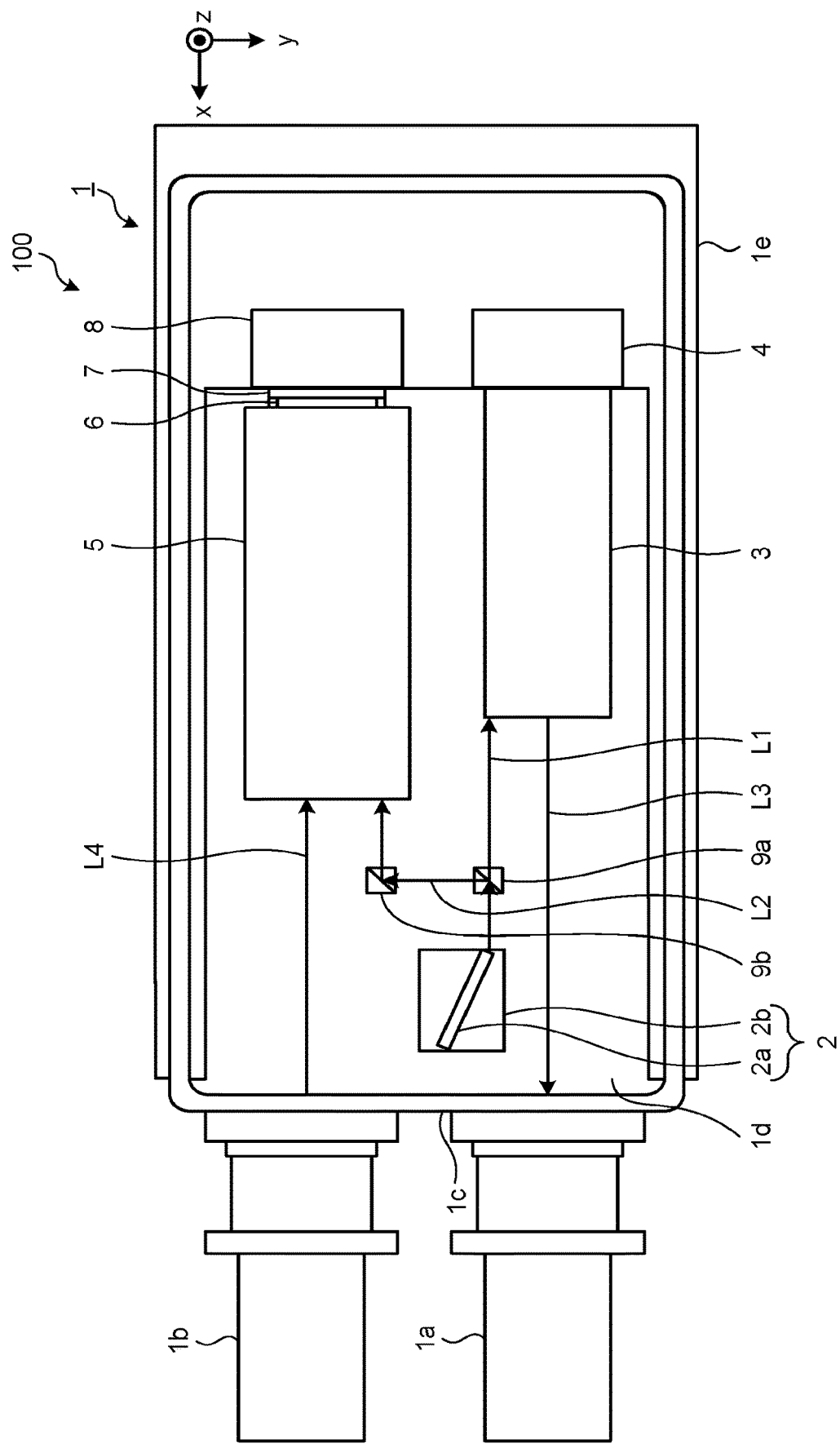
FIG. 1 is a schematic diagram illustrating an internal configuration of an optical module according to an embodiment.

FIG. 1 is a schematic diagram illustrating an internal configuration of an optical module according to an embodiment. This optical module 100 includes a housing 1. The housing 1 includes a signal optical power port 1a, a signal beam input port 1b, a side wall part 1c, a bottom plate part 1d, a terminal part 1e, and an upper lid part. FIG. 1 is a top view from the positive side in the z direction in a state in which the upper lid part is removed. The side wall part 1c is a frame-plate member having four surfaces parallel to the yz plane or the zx plane, each surface being substantially orthogonal to the bottom plate part 1d. The signal optical power port 1a and the signal beam input port 1b are provided on the positive side of the side wall part 1c in the x direction. The signal optical power port 1a is connected with an optical fiber for outputting a signal beam to the outside. The signal beam input port 1b is connected with an optical fiber for inputting a signal beam from the outside. The bottom plate part 1d is a plate member parallel to the xy plane. The terminal part 1e is provided at part of the side wall part 1c except for the positive side in the x direction. The terminal part 1e extends inside and outside the optical module 100.

The bottom plate part 1d is made of material having a high thermal conductivity, such as copper tungsten (CuW), copper molybdenum (CuMo), or aluminum oxide ($Al_2O_3$). The other part of the housing 1 is made of material having a small thermal expansion coefficient, such as a Fe—Ni—Co alloy or aluminum oxide ($Al_2O_3$).

The terminal part 1e is made of insulating material, and a wiring pattern made of a conductor is formed on the surface of the terminal part 1e and inside the terminal part 1e. The wiring pattern of the terminal part 1e is electrically connected with a controller provided outside the optical module 100 and configured to control operation of the optical module 100. The controller includes, for example, an IC.

The following components are housed and fixed inside the optical module 100: a chip-on sub-mount 2, a modulation unit 3, a modulator driver 4, a coherent mixer 5, a balanced photodiode (PD) array 6, a carrier substrate 7, an integrated circuit 8, a beam splitter 9a, and a reflection mirror 9b.

In the optical module 100, these components are mounted inside the housing 1, and the upper lid part is attached to achieve air-tightness sealing. These components except for the modulator driver 4, the integrated circuit 8, the balanced PD array 6, and the carrier substrate 7 are mounted on a base or a temperature adjustment element disposed inside the housing 1. The modulator driver 4 and the integrated circuit 8 are mounted on the terminal part 1e. The balanced PD array 6 and the carrier substrate 7 will be described in detail later.

The optical module 100 is configured as an optical transceiver from which an output signal beam is output through the signal optical power port 1a and to which an input optical signal beam is input through the signal beam input port 1b. The configuration and function of each component will be described below.

Optical Transmitter

First, the configurations and functions of components that function as an optical transmitter will be described below.

The chip-on sub-mount 2 includes a laser element 2a, and a sub-mount 2b on which the laser element 2a is mounted. The laser element 2a is, for example, a wavelength-tunable laser element. The sub-mount 2b is made of a material having high thermal conductivity and efficiently releases heat generated by the laser element 2a to the base on which the sub-mount 2b is mounted.

The laser element 2a is supplied with electrical power through the wiring pattern formed at the terminal part 1e and outputs a laser beam L1 of continuous waves (CW) and linearly polarized waves in the negative side in the x direction from a front facet.

The beam splitter 9a bifurcates part of the laser beam L1 as a laser beam L2.

The modulation unit 3 includes a modulator configured to modulate the laser beam L1 and generate modulated beams. The modulator is, for example, a Mach-Zehnder (MZ) phase modulator made of indium phosphorus (InP) as a constituent material and is a publicly-known modulator configured to function as an IQ modulator when driven the modulator driver 4. Such a phase modulator is same as that disclosed in, for example, International Publication No. WO 2016/021163. The modulator driver 4 includes, for example, an IC, and operation thereof is controlled by the controller.

The modulator generates modulated beams that are linearly polarized beams having polarization planes orthogonal to each other and are IQ-modulated. The two modulated beams become an output signal beam L3 through polarization synthesis by an optical system included in the modulation unit 3 and are output to the positive side in the x direction.

The signal optical power port 1a receives inputting of the output signal beam L3 and outputs the output signal beam L3 outside the housing 1.

Optical Receiver

Subsequently, the configurations and functions of components that function as an optical receiver will be described below.

The signal beam input port 1b receives inputting of an input signal beam L4 from the outside and inputs the input signal beam L4 to the coherent mixer 5.

Meanwhile, the reflection mirror 9b reflects the laser beam L2, which is part of the laser beam L1, into the coherent mixer 5 as a local beam.

The coherent mixer 5 as an optical element processes the laser beam L2 input as a local beam and the input signal beam L4 through interference, generates processed signal beams, and outputs the processed signal beams to the balanced PD array 6. The processed signal beams are four signal beams of an Ix signal beam corresponding to the I component of an X polarized wave, a Qx signal beam corresponding to the Q component of an X polarized wave, an Iy signal beam corresponding to the I component of a Y polarized wave, and a Qy signal beam corresponding to the Q component of a Y polarized wave. The coherent mixer 5 is, for example, a publicly-known coherent mixer made of a PLC.

The balanced PD array 6 is optically connected with the coherent mixer 5. The balanced PD array 6 includes four balanced PDs, receives the four processed signal beams, converts each processed signal beam into a current signal, and outputs the current signal to the integrated circuit 8.

The integrated circuit 8 includes a transimpedance amplifier (TIA), and operation thereof is controlled by the controller. The integrated circuit 8 converts, into a voltage signal, the current signal input from each of the four balanced PDs and outputs the voltage signal. The output voltage signal is transmitted to the controller or a higher-level control device through the wiring pattern formed at the terminal part 1*e* and is used demodulate the input signal beam L4.

Figure 2:
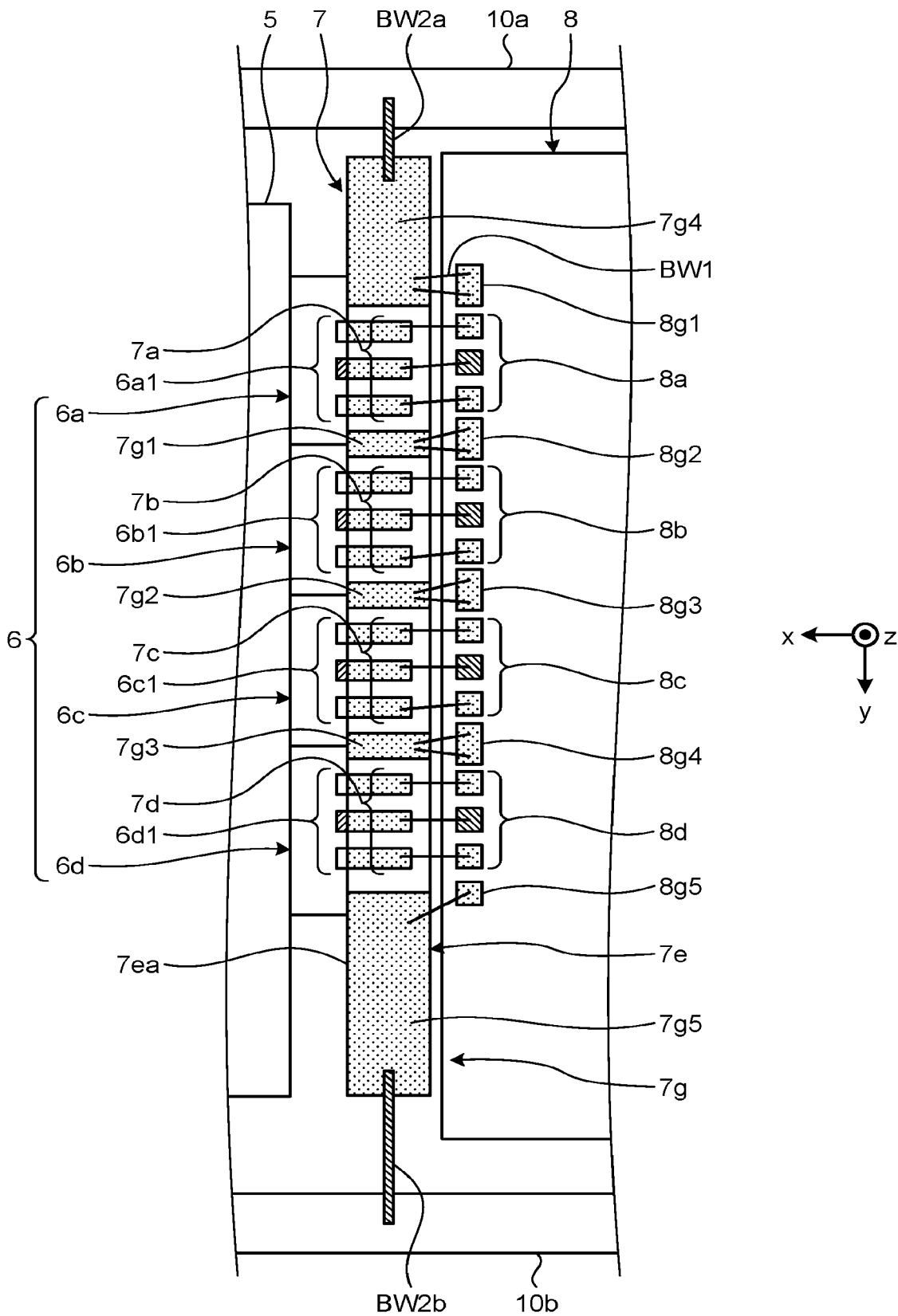
FIG. 2 is a schematic diagram illustrating a detailed configuration of part of FIG. 1.
Figure 3:
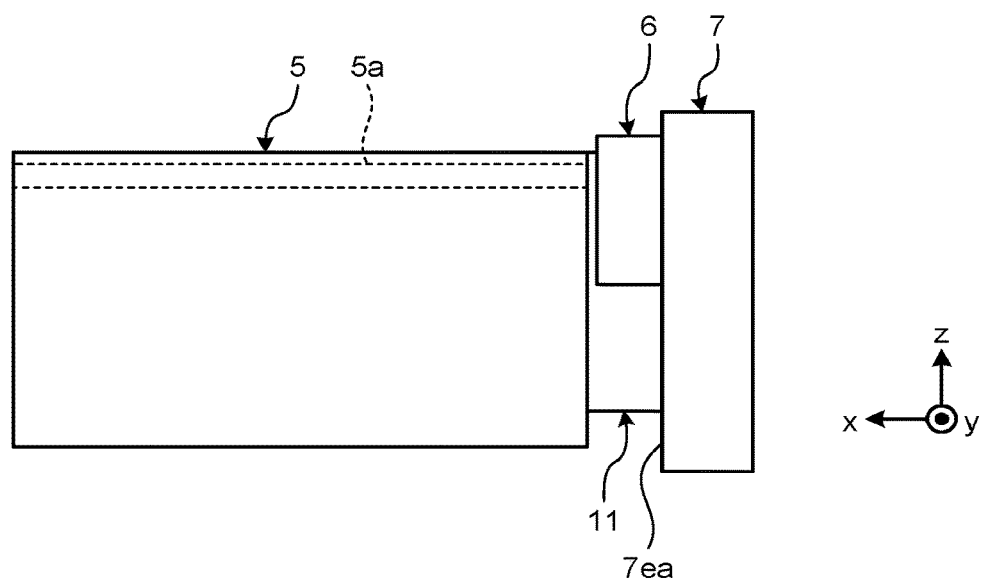
FIG. 3 is a schematic diagram illustrating a detailed configuration of part of FIG. 1.

FIGS. 2 and 3 are each a schematic diagram illustrating a detailed configuration of part of FIG. 1. FIG. 2 illustrates a top view of the coherent mixer 5, the balanced PD array 6, the carrier substrate 7, and the integrated circuit 8, in particular, when viewed from the positive side in the z direction. FIG. 3 illustrates a side view of the coherent mixer 5, the balanced PD array 6, and the carrier substrate 7, in particular, when viewed from the positive side in the y direction.

As illustrated in FIG. 2, the balanced PD array 6 includes, as a plurality of photoelectric elements, four balanced PDs 6*a*, 6*b*, 6*c*, and 6*d* arrayed in the y direction. The balanced PD 6*a* includes a first terminal group 6*a*1. The first terminal group 6*a*1 consists of three terminals, specifically, two anode terminals and one cathode terminal. The one cathode terminal, which is hatched, is disposed between the two anode terminals in the y direction. Similarly, the balanced PDs 6*b*, 6*c*, and 6*d* include first terminal groups 6*b*1, 6*c*1, and 6*d*1, respectively. The first terminal groups 6*b*1, 6*c*1, and 6*d*1 each consist of three terminals, specifically, two anode terminals and one cathode terminal.

The integrated circuit 8 includes four second terminal groups 8*a*, 8*b*, 8*c*, and 8*d*, ground terminals 8*g*1 and 8*g*5, and ground terminals 8*g*2, 8*g*3, and 8*g*4 arrayed in the y direction.

The second terminal group 8*a* consists of three signal input terminals. The three signal input terminals are electrically connected with the respective three terminals of the first terminal group 6*a*1 of the balanced PD 6*a* as described later. For example, a current signal output from a cathode terminal of the first terminal group 6*a*1 is input to a hatched signal input terminal in the second terminal group 8*a*. Similarly, the second terminal groups 8*b*, 8*c*, and 8*d* each consist of three signal input terminals. The three signal input terminals are electrically connected with the respective three terminals of the corresponding one of the first terminal groups 6*b*1, 6*c*1, and 6*d*1.

The ground terminal 8*g*2 is disposed between the second terminal groups 8*a* and 8*b* to achieve isolation between the second terminal groups 8*a* and 8*b*. Similarly, the ground terminal 8*g*3 is disposed between the second terminal groups 8*b* and 8*c*. The ground terminal 8*g*4 is disposed between the second terminal groups 8*c* and 8*d*. The ground terminal 8*g*1 is disposed on the negative side of the second terminal group 8*a* in the y direction. The ground terminal 8*g*5 is disposed on the positive side of the second terminal group 8*d* in the y direction.

The carrier substrate 7 has a configuration in which various wiring parts to be described later are formed on the surface of a rectangular parallelepiped body 7*e* made of ceramic, glass, resin, or the like. The body 7*e* preferably has a low dielectric permittivity to obtain a high-frequency characteristic. The four balanced PDs 6*a*, 6*b*, 6*c*, and 6*d* of the balanced PD array 6 are arrayed in a predetermined array direction aligned with the y direction and are mounted on the carrier substrate 7. When a surface of the body 7*e* on which the balanced PD array 6 is mounted is referred to as a mounting surface 7*ea*, the carrier substrate 7 is bonded and fixed to the coherent mixer 5 by a bonding agent 11 at the mounting surface 7*ea* as illustrated in FIG. 3. In the present embodiment, the balanced PD array 6 is bonded and fixed to the coherent mixer 5 by the bonding agent 11. The bonding agent 11 contains, for example, ultraviolet curable resin.

In the housing 1, common ground pads 10*a* and 10*b* are provided on both end sides of the carrier substrate 7. Both end sides are both end sides of the carrier substrate 7 in the array direction of the balanced PDs 6*a*, 6*b*, 6*c*, and 6*d*, in other words, the y direction. The common ground pads 10*a* and 10*b* function as ground pads common to components housed in the housing 1 and are electrically connected with a ground such as a case ground of the housing 1.

FIG. 3 illustrates an optical waveguide 5*a* included in the coherent mixer 5. The optical waveguide 5*a* is made of four optical waveguides, and four processed signal beams guided by the optical waveguide 5*a* are output to the balanced PDs 6*a*, 6*b*, 6*c*, and 6*d*, respectively, of the balanced PD array 6.

Figure 4:
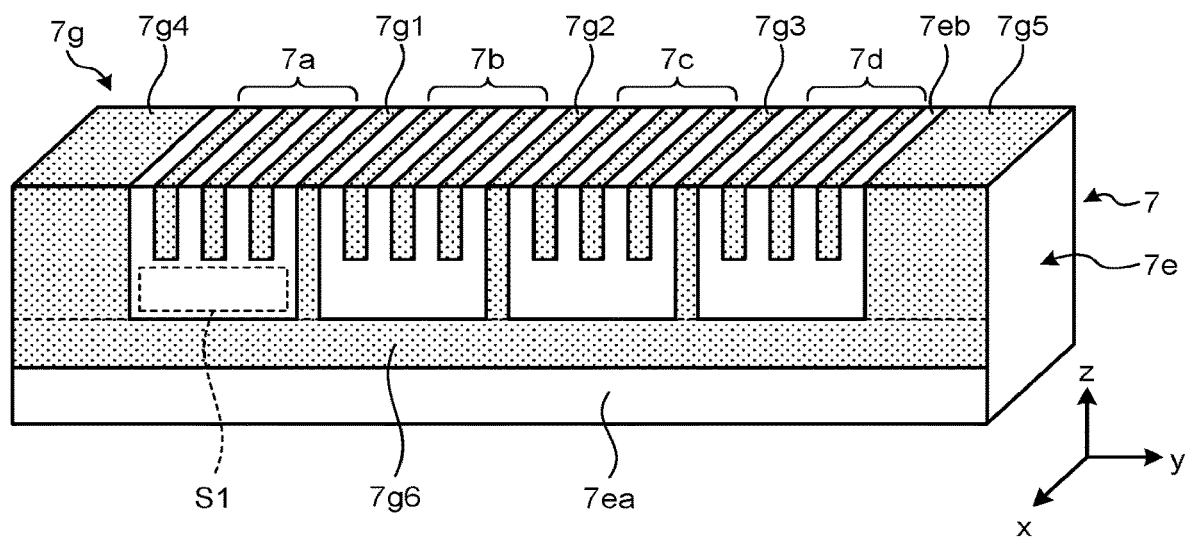
FIG. 4 is a schematic perspective view of a carrier substrate.
Figure 5:
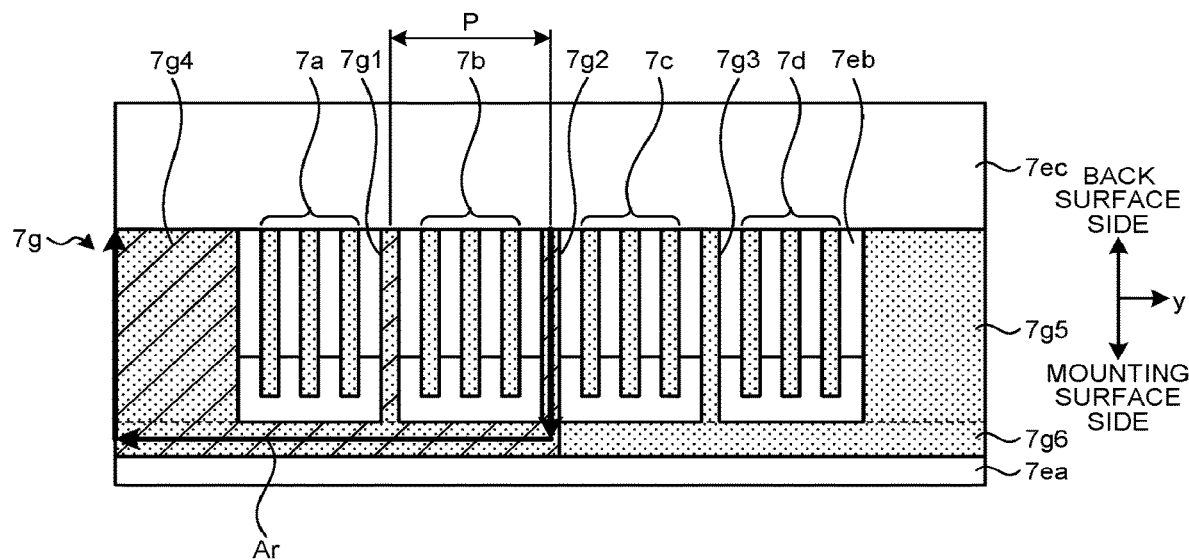
FIG. 5 is a schematic developed view of part of the carrier substrate.

The carrier substrate 7 will be more specifically described. FIG. 4 is a schematic perspective view of the carrier substrate 7. FIG. 5 is a schematic developed view of part of the carrier substrate 7. The carrier substrate 7 includes the body 7*e*, and four signal wiring parts 7*a*, 7*b*, 7*c*, and 7*d*, and a ground wiring part 7*g* formed on the surface of the body 7*e*.

The body 7*e* has the mounting surface 7*ea* parallel to the yz plane, an upper surface 7*eb* parallel to the xy plane, and a back surface 7*ec* facing the mounting surface 7*ea*.

The signal wiring parts 7*a*, 7*b*, 7*c*, and 7*d* and the ground wiring part 7*g* are patterned conductor wiring films, and in the present embodiment, are metal wiring films.

The signal wiring parts 7*a*, 7*b*, 7*c*, and 7*d* are each made of three metal wiring films extending from the mounting surface 7*ea* to the upper surface 7*eb*. As illustrated in FIG. 2, the three metal wiring films of the signal wiring part 7*a* are electrically connected with the respective three terminals of the first terminal group 6*a*1 of the balanced PD 6*a* by solder or the like at parts existing at the mounting surface 7*ea*. Similarly, the three metal wiring films each of the signal wiring parts 7*b*, 7*c*, and 7*d* are electrically connected with the respective three terminals of each of the balanced PDs 6*b*, 6*c*, and 6*d* by solder or the like at parts existing at the mounting surface 7*ea*. The widths of the signal wiring parts 7*a*, 7*b*, 7*c*, and 7*d* are, for example, 0.1 mm but not particularly limited.

The three metal wiring films of the signal wiring part 7*a* are also electrically connected with the respective three signal input terminals of the second terminal group 8*a* of the integrated circuit 8 by wire-bonding with bonding wires BW1 made of gold (Au) or the like. In other words, the signal wiring part 7*a* is interposed in electrical connection between the first terminal group 6*a*1 of the balanced PD 6*a* and the second terminal group 8*a* of the integrated circuit 8.

Similarly, the three metal wiring films of each of the signal wiring parts 7*b*, 7*c*, and 7*d* are electrically connected with the respective three signal input terminals of the corresponding one of the second terminal groups 8*b*, 8*c*, and 8*d* of the integrated circuit 8 by wire-bonding with bonding wires BW1. In other words, the signal wiring parts 7*b*, 7*c*, and 7*d* are interposed in electrical connection between the first terminal groups 6*b*1, 6*c*1, and 6*d*1 of the balanced PDs 6*b*, 6*c*, and 6*d* and the second terminal groups 8*b*, 8*c*, and 8*d* of the integrated circuit 8.

The ground wiring part 7g includes three terminal pattern parts 7g1, 7g2, and 7g3, two common pattern parts 7g4 and 7g5, and a coupling part 7g6.

The terminal pattern parts 7g1, 7g2, and 7g3 are made of three metal wiring films extending from the mounting surface 1ea to the upper surface 7eb and are each disposed between the corresponding pair of the signal wiring parts 7a, 7b, 7c, and 7d. Specifically, the terminal pattern part 7g1 is disposed between the signal wiring parts 7a and 7b. The terminal pattern part 7g2 is disposed between the signal wiring parts 7b and 7c. The terminal pattern part 7g3 is disposed between the signal wiring parts 7c and 7d. The widths of the terminal pattern parts 7g1, 7g2, and 7g3 are, for example, 0.1 mm but not particularly limited. The terminal pattern parts 7g1, 7g2, and 7g3 are arranged at equal intervals in the y direction, and a pitch P between terminal pattern parts adjacent to each other is 0.3 to 0.6 mm.

The terminal pattern parts 7g1, 7g2, and 7g3 are electrically connected with the ground terminals 8g2, 8g3, and 8g4, respectively, by wire-bonding with bonding wires BW1.

The common pattern parts 7g4 and 7g5 are metal wiring films extending from the mounting surface 7ea to the upper surface 7eb and disposed on sides where the common ground pads 10a and 10b are provided on the carrier substrate 7, in other words, on both sides of the carrier substrate 7 in the y direction. The common pattern part 7g4 and the common ground pad 10a are electrically connected with each other by wire-bonding with a bonding wire BW2a. The common pattern part 7g5 and the common ground pad 10b are electrically connected with each other by wire-bonding with a bonding wire BW2b.

The coupling part 7g6 is a metal wiring film provided on the mounting surface 7ea and extending in the y direction, and electrically connects the terminal pattern parts 7g1, 7g2, and 7g3 with the common pattern parts 7g4 and 7g5. A space S1 between the coupling part 7g6 and the signal wiring part 7a, which is illustrated in FIG. 4, is provided to prevent short-circuit of the coupling part 7g6 with three terminals of the balanced PD 6a mounted on the mounting surface 7ea. The same space is provided between the coupling part 7g6 and each of the signal wiring parts 7b, 7c, and 7d.

In the optical module 100 thus configured, the carrier substrate 7 is fixed to the coherent mixer 5 at the mounting surface 7ea. Since the coherent mixer 5 is fixed to the housing 1, the carrier substrate 7 is fixed to the housing 1 at one surface that is the mounting surface 7ea, but not fixed at any other surface. This configuration prevents stress application on the carrier substrate 7 in two directions due to temperature change or the like, thereby preventing degradation of reliability of the optical module 100.

The ground terminals 8g2, 8g3, and 8g4 of the integrated circuit 8 are electrically connected with the common ground pads 10a and 10b through the ground wiring part 7g of the carrier substrate 7. With this configuration, no wiring needs to be routed to the bottom plate part 1d side of the housing 1 through a gap between the carrier substrate 7 and the integrated circuit 8. Thus, it is possible to minimize the gap between the carrier substrate 7 and the integrated circuit 8, thereby reducing the size of the optical module 100. Since the ground terminals 8g2, 8g3, and 8g4 of the integrated circuit 8 are electrically connected with the common ground pads 10a and 10b, the potentials of the ground terminals 8g2, 8g3, and 8g4 are stabilized.

As described above, the optical module 100 according to the present embodiment has a reduced size and reduced reliability degradation.

The length and area of an electric path from each of the ground terminals 8g2, 8g3, and 8g4 of the integrated circuit 8 to the common ground pad 10a or 10b are preferably small to obtain a high-frequency characteristic.

For example, the body 7e of the carrier substrate 7 is made of alumina (dielectric permittivity: 9.8), and the signal wiring parts 7a, 7b, 7c, and 7d and the ground wiring part 7g are Au films having a thickness of 8 μm. In this case, for example, the length of a path corresponding to a part from any of the terminal pattern parts 7g1, 7g2, and 7g3 to any of the common pattern parts 7g4 and 7g5 in the ground wiring part 7g is preferably equal to or smaller than 4.1 mm, more preferably equal to or smaller than 3.5 mm. Alternatively, the length of the path corresponding to the part from any of the terminal pattern parts 7g1, 7g2, and 7g3 to any of the common pattern parts 7g4 and 7g5 is preferably equal to or smaller than nine times the pitch P between terminal pattern parts adjacent to each other among the terminal pattern parts 7g1, 7g2, and 7g3, preferably equal to or smaller than seven times the pitch P. Alternatively, the area of the part from any of the terminal pattern parts 7g1, 7g2, and 7g3 to any of the common pattern parts 7g4 and 7g5 is preferably equal to or smaller than 1.2 mm².

As illustrated with three arrows Ar in FIG. 5, the longest path in the carrier substrate 7 is a path starting at an end part of the terminal pattern part 7g2 on the back surface side, passing through the center of the terminal pattern part 7g2 in the width direction thereof (y direction), through the center of the coupling part 7g6 in the width direction thereof (direction orthogonal to the y direction), and through an edge of the common pattern part 7g4 on the negative side in the y direction, and reaching an end part of the common pattern part 7g4 on the back surface side. Thus, the length of this path is preferably equal to or smaller than 3.5 mm, or equal to or smaller than seven times the pitch P because, in this case, the length of the path corresponding to the part from any of the other terminal pattern parts 7g1 and 7g3 to any of the common pattern parts 7g4 and 7g5 is equal to or smaller than 3.5 mm, or equal to or smaller than seven times the pitch P. In addition, the area of a hatched part of the ground wiring part 7g, in other words, the sum of the area of the terminal pattern part 7g2, the area of the common pattern part 7g4, and the area of a part extending from a part connected with the terminal pattern part 7g2 to a part connected with the common pattern part 7g4 in the coupling part 7g6 is preferably equal to or smaller than 1.2 mm² because, in this case, the area of the part from any of the other terminal pattern parts 7g1 and 7g3 to any of the common pattern parts 7g4 and 7g5 is equal to or smaller than 1.2 mm². The areas of the common pattern parts 7g4 and 7g5 are equal to each other. In a case in which the areas are different from each other, as well, the area of the part from any of the terminal pattern parts 7g1, 7g2, and 7g3 to any of the common pattern parts 7g4 and 7g5 is preferably equal to or smaller than 1.2 mm².

The length of the path is more preferably equal to or smaller than 3.0 mm, or equal to or smaller than six times the pitch P. The area of the corresponding part is more preferably not larger than 0.8 mm².

First Modification of Carrier Substrate

In the optical module 100 according to the embodiment, the carrier substrate 7 may be replaced with a carrier substrate according to a first modification described below.

Figure 6:
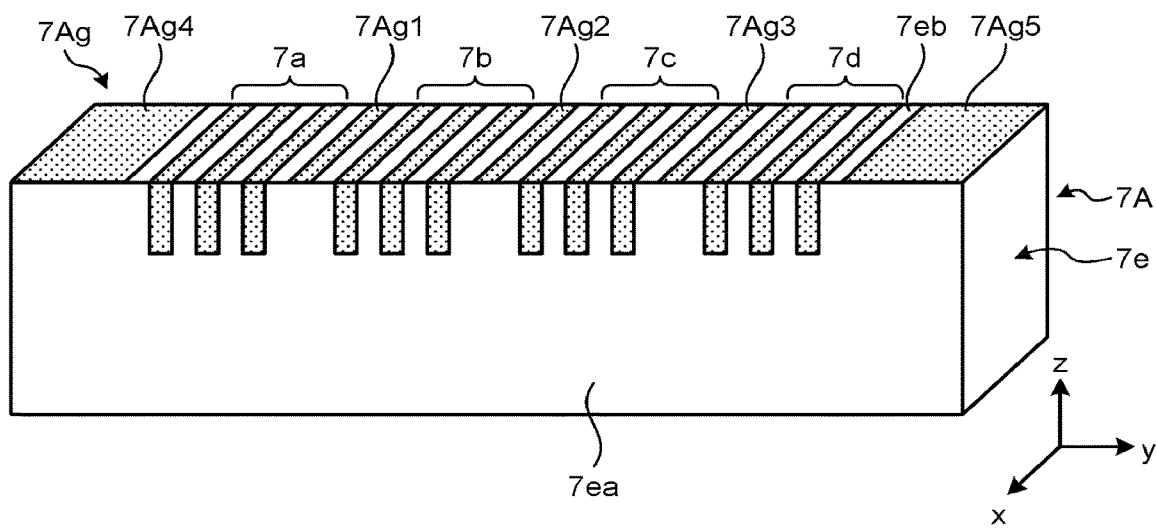
FIG. 6 is a schematic perspective view of a carrier substrate according to a first modification.
Figure 7:
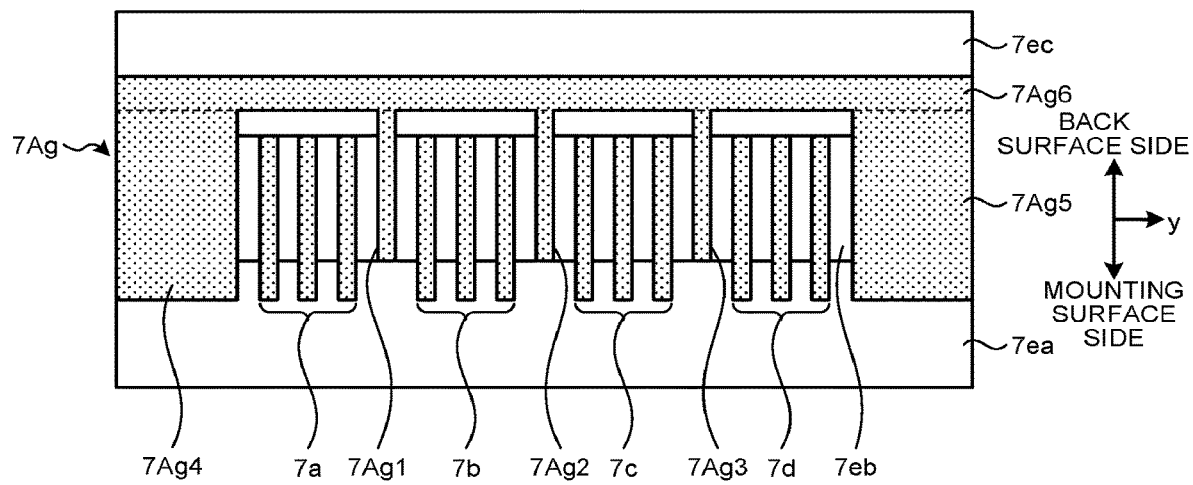
FIG. 7 is a schematic developed view of part of the carrier substrate according to the first modification.

FIG. 6 is a schematic perspective view of the carrier substrate according to the first modification. FIG. 7 is a schematic developed view of part of the carrier substrate according to the first modification. This carrier substrate 7A has a configuration in which a ground wiring part 7Ag is provided in place of the ground wiring part 7g in the configuration of the carrier substrate 7 illustrated in FIGS. 4 and 5 and the like.

The ground wiring part 7Ag includes three terminal pattern parts 7Ag1, 7Ag2, and 7Ag3, two common pattern parts 7Ag4 and 7Ag5, and a coupling part 7Ag6.

The terminal pattern parts 7Ag1, 7Ag2, and 7Ag3 are made of three metal wiring films extending from the mounting surface 7ea to the upper surface 7eb and each disposed between the corresponding pair of the signal wiring parts 7a, 7b, 7c, and 7d. The widths of the terminal pattern parts 7Ag1, 7Ag2, and 7Ag3 are, for example, 0.1 mm but not particularly limited. The terminal pattern parts 7Ag1, 7Ag2, and 7Ag3 are arranged at equal intervals in the y direction. The terminal pattern parts 7Ag1, 7Ag2, and 7Ag3 are electrically connected with the ground terminals 8g2, 8g3, and 8g4, respectively, of the integrated circuit 8 by wire-bonding with bonding wires.

The common pattern parts 7Ag4 and 7Ag5 are metal wiring films extending from the upper surface 7eb to the back surface Tec and disposed on both sides of the carrier substrate 7A in the y direction. The common pattern part 7Ag4 and the common ground pad 10a are electrically connected with each other by wire-bonding with bonding wires. The common pattern part 7Ag5 and the common ground pad 10b are electrically connected with each other by wire-bonding with bonding wires.

The coupling part 7Ag6 is a metal wiring film provided on the back surface Tec and extending in the y direction, and electrically connects the terminal pattern parts 7Ag1, 7Ag2, and 7Ag3 with the common pattern parts 7Ag4 and 7Ag5.

In an optical module configured by using the carrier substrate 7A thus configured, as well, the carrier substrate 7A is fixed to the coherent mixer 5 at the mounting surface 7ea, and thus degradation of reliability of the optical module is prevented.

The ground terminals 8g2, 8g3, and 8g4 of the integrated circuit 8 are electrically connected with the common ground pads 10a and 10b through the ground wiring part 7Ag of the carrier substrate 7A, which leads to size reduction of the optical module.

In the carrier substrate 7A, the coupling part 7Ag6 is provided on the back surface 7ec. With this configuration, no space S1 needs to be provided unlike the carrier substrate 7. Accordingly, the length of a path corresponding to a part from any of the terminal pattern parts 7Ag1, 7Ag2, and 7Ag3 to any of the common pattern parts 7Ag4 and 7Ag5 in the ground wiring part 7Ag and the area of the part can be reduced. This further enhances the high-frequency characteristic of the optical module.

Second Modification of Carrier Substrate

In the optical module 100 according to the embodiment, the carrier substrate 7 may be replaced with a carrier substrate according to a second modification described below.

Figure 8:
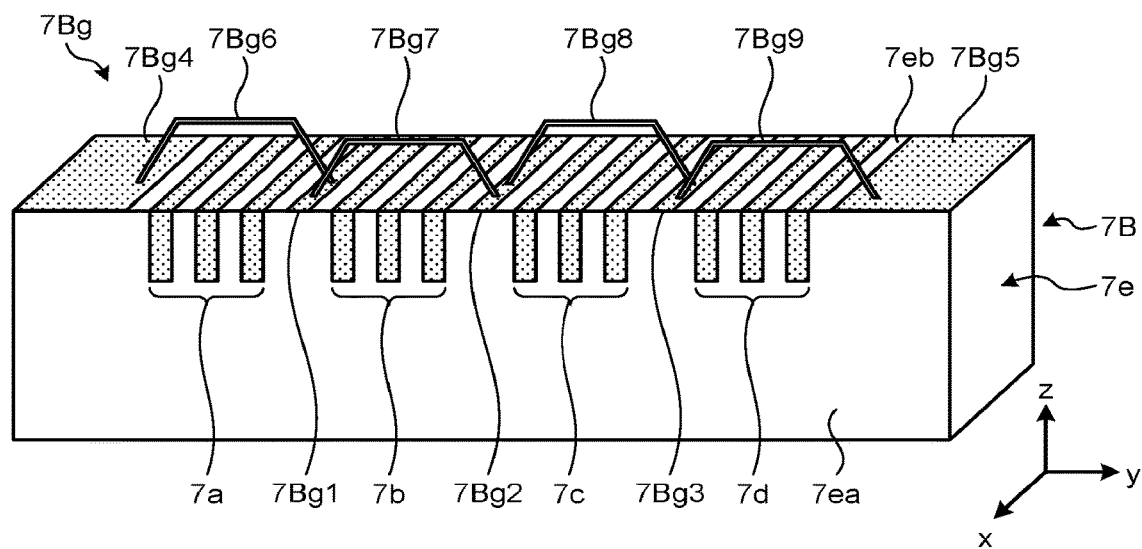
FIG. 8 is a schematic perspective view of a carrier substrate according to a second modification.
Figure 9:
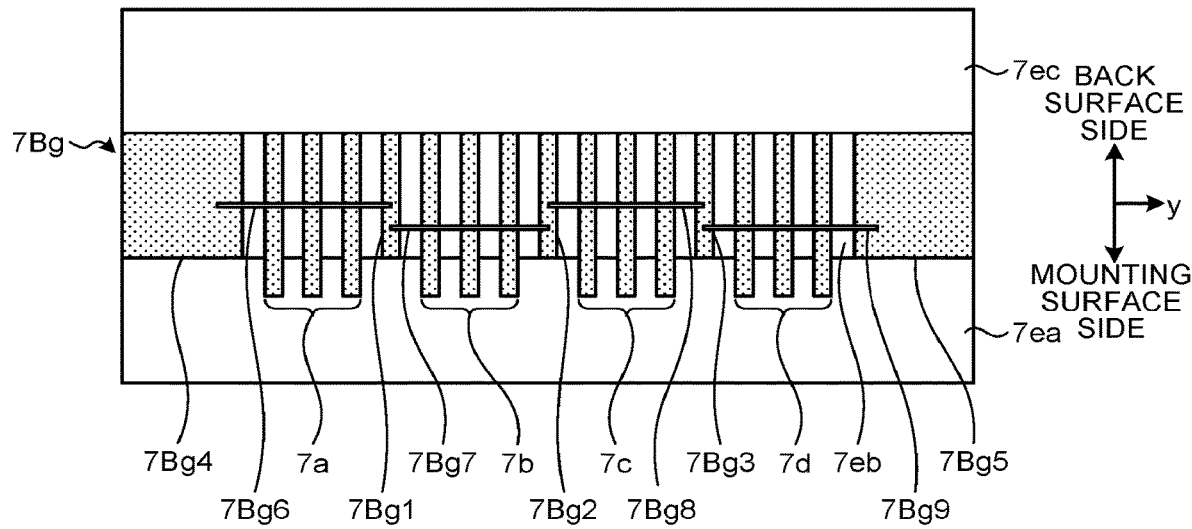
FIG. 9 is a schematic developed view of part of the carrier substrate according to the second modification.

FIG. 8 is a schematic perspective view of the carrier substrate according to the second modification. FIG. 9 is a schematic developed view of part of the carrier substrate according to the second modification. This carrier substrate 7B has a configuration in which the ground wiring part 7Bg is provided in place of the ground wiring part 7g in the configuration of the carrier substrate 7 illustrated in FIGS. 4 and 5 and the like.

The ground wiring part 7Bg includes three terminal pattern parts 7Bg1, 7Bg2, and 7Bg3, two common pattern parts 7Bg4 and 7Bg5, and four coupling parts 7Bg6, 7Bg7, 7Bg8, and 7Bg9.

The terminal pattern parts 7Bg1, 7Bg2, and 7Bg3 are made of three metal wiring films extending on the upper surface 7eb and each disposed between the corresponding pair of the signal wiring parts 7a, 7b, 7c, and 7d. The widths of the terminal pattern parts 7Bg1, 7Bg2, and 7Bg3 are, for example, 0.1 mm but not particularly limited. The terminal pattern parts 7Bg1, 7Bg2, and 7Bg3 are arranged at equal intervals in the y direction. The terminal pattern parts 7Bg1, 7Bg2, and 7Bg3 are electrically connected with the ground terminals 8g2, 8g3, and 8g4, respectively, of the integrated circuit 8 by wire-bonding with bonding wires.

The common pattern parts 7Bg4 and 7Bg5 are metal wiring films extending on the upper surface 7eb and disposed on both sides of the carrier substrate 7B in the y direction. The common pattern part 7Bg4 and the common ground pad 10a are electrically connected with each other by wire-bonding with bonding wires. The common pattern part 7Bg5 and the common ground pad 10b are electrically connected with each other by wire-bonding with bonding wires.

The coupling parts 7Bg6, 7Bg7, 7Bg8, and 7Bg9 are bonding wires made of Au or the like. The coupling part 7Bg6 electrically connects the terminal pattern part 7Bg1 and the common pattern part 7Bg4 on the upper surface 7eb side. The coupling part 7Bg7 electrically connects the terminal pattern part 7Bg1 and the terminal pattern part 7Bg2 on the upper surface 7eb side. The coupling part 7Bg8 electrically connects the terminal pattern part 7Bg2 and the terminal pattern part 7Bg3 on the upper surface 7e b side. The coupling part 7Bg9 electrically connects the terminal pattern part 7Bg3 and the common pattern part 7Bg5 on the upper surface 7eb side.

In an optical module configured by using the carrier substrate 7B thus configured, as well, the carrier substrate 7B is fixed to the coherent mixer 5 at the mounting surface lea, and thus degradation of reliability of the optical module is prevented.

The ground terminals 8g2, 8g3, and 8g4 of the integrated circuit 8 are electrically connected with the common ground pads 10a and 10b through the ground wiring part 7Bg of the carrier substrate 7B, which leads to size reduction of the optical module.

In the carrier substrate 7B as well, no space S1 needs to be provided unlike the carrier substrate 7. Accordingly, the length of a path corresponding to a part from any of the terminal pattern parts 7Bg1, 7Bg2, and 7Bg3 to any of the common pattern parts 7Bg4 and 7Bg5 in the ground wiring part 7Bg and the area of the part can be reduced. This further enhances the high-frequency characteristic of the optical module.

CALCULATION EXAMPLES 1 to 6

Simulation calculation was performed on a frequency characteristic of a loss when a high-frequency signal flows from the mounting surface lea side to the back surface Tec side through a metal wiring film on the negative side in the y direction at the signal wiring part 7a in each of the carrier substrate 7 of the embodiment and the carrier substrates 7A and 7B of the modifications. The calculation was performed under a condition that the three terminal pattern parts and two common pattern parts of the ground wiring part were grounded and connected with the ground terminals 8g2, 8g3, and 8g4 of the integrated circuit 8 or the common ground pad 10a or 10b through bonding wires having a length of 200 μm. The calculation was also performed with a configuration in which the body 7e was made of alumina and the signal wiring part and the ground wiring part were made of Au films having a thickness of 8 μm. Microwave Office manufactured by Applied Wave Research Corporation was used in the calculation.

In Calculation Examples 1 to 4, the calculation was performed by using the carrier substrate 7 of the embodiment. Calculation Examples 1 to 4 correspond to cases in which the length of the path illustrated with the three arrows Ar in FIG. 5 is 3.2 mm (7), 3.3 mm (7.3), 3.5 mm (7.7), and 4.1 mm (9), respectively (each parenthesis includes an integer multiple of the pitch (pitch P) between adjacent ground electrodes). In Calculation Example 5, the calculation was performed by using the carrier substrate 7A according to the first modification. In Calculation Example 6, the calculation was performed by using the carrier substrate 7B according to the second modification. When each pair of electrodes are connected through a wire as illustrated in FIG. 8, the length of the path illustrated with the three arrows Ar in FIG. 5 is specified based on a path through the coupling parts 7Bg6, 7Bg7.

Figure 10:
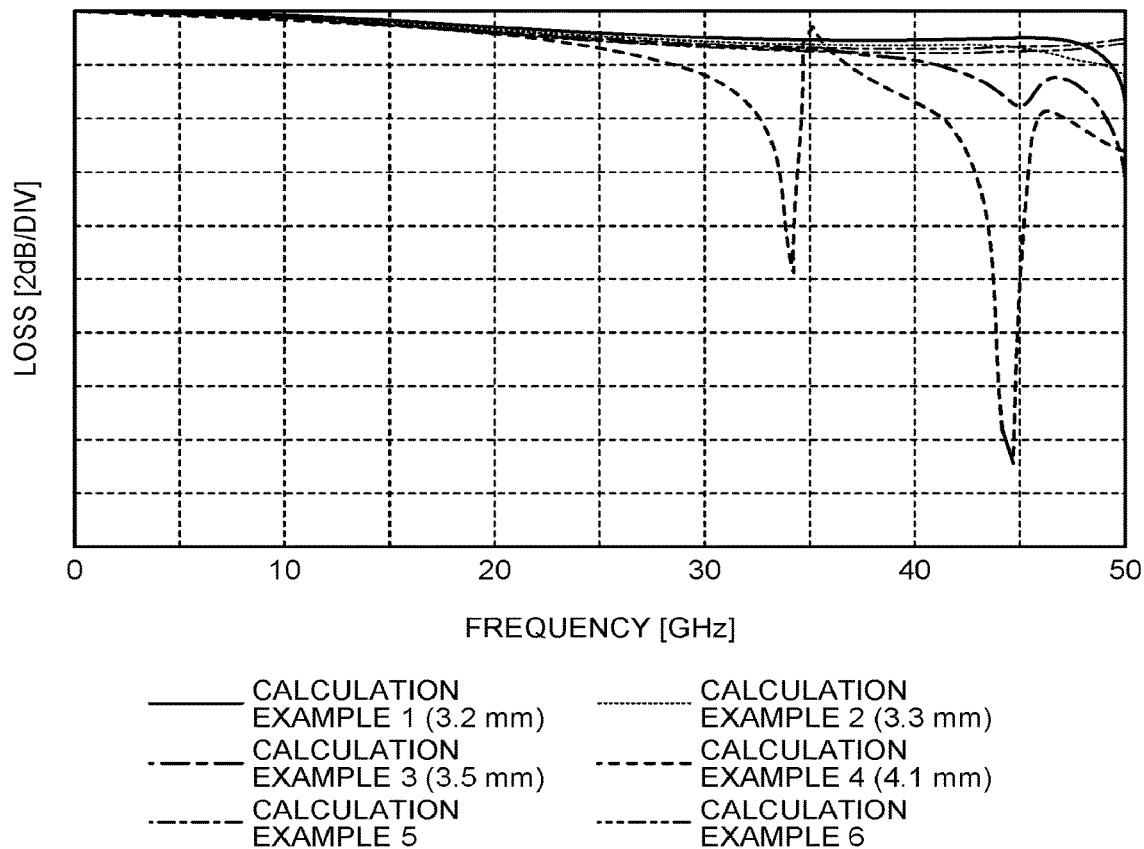
FIG. 10 is a diagram illustrating a frequency characteristic of a loss in Calculation Examples 1 to 6.

FIG. 10 is a diagram illustrating the frequency characteristic of the loss in Calculation Examples 1 to 6. The loss is expressed as a relative value with respect to a loss when the carrier substrate is extended to the bottom plate part of the housing and grounded at the bottom plate part. In Calculation Examples 1 and 2, the loss has a smooth shape up to 48 GHz approximately, and a favorable characteristic is obtained at 40 GHz, which is an exemplary frequency of a high-frequency signal used in optical communication. In Calculation Example 3, a dip is observed near 45 GHz, but a favorable characteristic is obtained at 40 GHz. In Calculation Example 4, a dip is observed near 34 GHz, but a favorable characteristic is obtained at 20 GHz, which is an exemplary frequency of a high-frequency signal used in optical communication. In Calculation Examples 5 and 6, the loss has a smooth shape up to 50 GHz approximately, and a favorable characteristic is obtained.

In the above-described embodiment and modifications, each common pattern part of the ground wiring part of the carrier substrate is electrically connected with the common ground pads 10a and 10b by wire-bonding with bonding wires, but may be electrically connected by resin bridge. In this case, the carrier substrate is preferably not fixed to the housing by the resin bridge.

In the above-described embodiment and modifications, the carrier substrate may be fixed to the coherent mixer 5 on the mounting surface 7ea by the bonding agent 11 with only the balanced PD array 6 being interposed therebetween or may be fixed to the coherent mixer 5 on the mounting surface 7ea by the bonding agent 11 without the balanced PD array 6 being interposed therebetween.

In the above-described embodiment and modifications, the common ground pads are provided on both end sides of the carrier substrate but may be provided on one end side.

In the above-described embodiment and modifications, each coupling part of the ground wiring part of the carrier substrate is made of a metal film or a bonding wire, but may be made of, for example, a conductor block having a rectangular parallelepiped shape or the like. The carrier substrate may be a laminated substrate and each coupling part may be buried in the carrier substrate. In this case, the coupling part is electrically connected with a terminal pattern part or a common pattern part through, for example, a via.

In the above-described embodiment and modifications, the carrier substrate is fixed to the housing 1 with the coherent mixer 5 being interposed therebetween, but the fixation to the housing 1 may be achieved in any fixation manner.

According to the present disclosure, it is possible to achieve an optical module having a reduced size and reduced reliability degradation.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module comprising:
   a plurality of photoelectric elements including first terminal groups each including an anode terminal and a cathode terminal;
   an integrated circuit including a plurality of second terminal groups and a plurality of ground terminals, the plurality of second terminal groups being electrically connected with the respective first terminal groups of the photoelectric elements, and the plurality of ground terminals each being disposed between two of the plurality of second terminal groups;
   a carrier substrate on which the plurality of photoelectric elements are arrayed in a predetermined array direction and mounted;
   a housing in which the plurality of photoelectric elements, the integrated circuit, and the carrier substrate are housed; and
   a common ground pad provided in the housing on at least one end side of the carrier substrate in the array direction, wherein
   the carrier substrate is fixed to one surface of the housing,
   the carrier substrate includes a plurality of signal wiring parts and a ground wiring part, the plurality of signal wiring parts being interposed in electrical connection between the first terminal groups of the plurality of photoelectric elements and the respective plurality of second terminal groups of the integrated circuit,
   the ground wiring part includes a plurality of terminal pattern parts, a common pattern part, and a coupling part, each of the terminal pattern parts being disposed between corresponding ones of the plurality of signal wiring parts and electrically connected with a corresponding one of the plurality of ground terminals, the common pattern part being disposed on a side where the common ground pad is provided on the carrier substrate, the coupling part electrically connecting each terminal pattern part of the plurality of terminal pattern parts and the common pattern part, and
   the plurality of ground terminals of the integrated circuit are electrically connected with the common ground pad through the ground wiring part of the carrier substrate.

2. The optical module according to claim 1, wherein a length of a path corresponding to a part from any of the plurality of terminal pattern parts to the common pattern part in the ground wiring part is equal to or smaller than 4.1 mm, or equal to or smaller than nine times a pitch between the plurality of terminal pattern parts adjacent to each other.

3. The optical module according to claim 2, wherein a length of a path corresponding to a part from any of the plurality of terminal pattern parts to the common pattern part in the ground wiring part is equal to or smaller than 3.5 mm, or equal to or smaller than seven times a pitch between the plurality of terminal pattern parts adjacent to each other.

4. The optical module according to claim 1, wherein an area of a part from any of the plurality of terminal pattern parts to the common pattern part is equal to or smaller than 1.2 mm.

5. The optical module according to claim 1, wherein the coupling part is provided on a mounting surface of the carrier substrate, the plurality of photoelectric elements being mounted on the mounting surface.

6. The optical module according to claim 1, wherein the coupling part is provided on a back surface facing a mounting surface of the carrier substrate, the plurality of photoelectric elements being mounted on the mounting surface.

7. The optical module according to claim 1, wherein the coupling part is made of a bonding wire.

8. The optical module according to claim 1, wherein the coupling part is made of a conductor block.

9. The optical module according to claim 1, wherein the coupling part is buried in the carrier substrate.

10. The optical module according to claim 1, wherein the common pattern part of the ground wiring part and the common ground pad are electrically connected with each other with a bonding wire.

11. The optical module according to claim 1, further comprising an optical element housed and fixed in the housing and optically connected with the plurality of photoelectric elements, wherein the carrier substrate is fixed to the housing by being fixed to the optical element.

12. The optical module according to claim 1, wherein the plurality of photoelectric elements include a photodiode and the integrated circuit includes a transimpedance amplifier.

* * * * *